(12) United States Patent
Sharma et al.

(10) Patent No.: US 11,289,509 B2
(45) Date of Patent: Mar. 29, 2022

(54) DOUBLE-GATED FERROELECTRIC FIELD-EFFECT TRANSISTOR

(71) Applicant: Intel Corporation, Santa Clara, CA (US)

(72) Inventors: Abhishek A. Sharma, Hillsboro, OR (US); Brian S. Doyle, Portland, OR (US); Ravi Pillarisetty, Portland, OR (US); Prashant Majhi, San Jose, CA (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/640,467

(22) PCT Filed: Sep. 29, 2017

(86) PCT No.: PCT/US2017/054538
§ 371 (c)(1),
(2) Date: Feb. 20, 2020

(87) PCT Pub. No.: WO2019/066948
PCT Pub. Date: Apr. 4, 2019

(65) Prior Publication Data
US 2020/0176457 A1    Jun. 4, 2020

(51) Int. Cl.
*H01L 21/00* (2006.01)
*H01L 27/1159* (2017.01)
(Continued)

(52) U.S. Cl.
CPC ........ *H01L 27/1159* (2013.01); *G11C 11/223* (2013.01); *H01L 29/516* (2013.01);
(Continued)

(58) Field of Classification Search
CPC . H01L 27/1159; H01L 29/516; G11C 11/223; G11C 11/2257; G11C 11/2273
See application file for complete search history.

(56) References Cited

U.S. PATENT DOCUMENTS 10,403,631 B1 *  9/2019  Lu ..................... H01L 27/11514
10,720,505 B2 *  7/2020  Then .................. H01L 29/2003
(Continued)

FOREIGN PATENT DOCUMENTS

JP    2010062221 A    3/2010
WO    2019066948 A1   4/2019

OTHER PUBLICATIONS

PCT International Preliminary Report on Patentability for Appl No. PCT/US2017/054538 dated Mar. 31, 2020, 11 pages.
(Continued)

*Primary Examiner* — Richard A Booth
(74) *Attorney, Agent, or Firm* — Schwabe, Williamson & Wyatt, P.C.

(57) ABSTRACT

A ferroelectric field-effect transistor (FeFET) includes first and second gate electrodes, source and drain regions, a semiconductor region between and physically connecting the source and drain regions, a first gate dielectric between the semiconductor region and the first gate electrode, and a second gate dielectric between the semiconductor region and the second gate electrode. The first gate dielectric includes a ferroelectric dielectric. In an embodiment, a memory cell includes this FeFET, with the first gate electrode being electrically connected to a wordline and the drain region being electrically connected to a bitline. In another embodiment, a memory array includes wordlines extending in a first direction, bitlines extending in a second direction, and a plurality of such memory cells at crossing regions of the wordlines and the bitlines. In each memory cell, the word-
(Continued)

line is a corresponding one of the wordlines and the bitline is a corresponding one of the bitlines.

20 Claims, 8 Drawing Sheets (51) Int. Cl.
      *G11C 11/22*       (2006.01)
      *H01L 29/51*       (2006.01)
      *H01L 29/78*       (2006.01)

(52) U.S. Cl.
      CPC ...... *H01L 29/7831* (2013.01); *G11C 11/2257* (2013.01); *G11C 11/2273* (2013.01)

(56) References Cited

U.S. PATENT DOCUMENTS

| | | | |
|---|---|---|---|
| 10,937,807 B2 * | 3/2021 | Doyle | ................. H01L 29/6684 |
| 2009/0261395 A1 | 10/2009 | Boescke | |
| 2010/0140589 A1 | 6/2010 | Ionescu | |
| 2015/0311349 A1 | 10/2015 | Ramaswamy | |
| 2017/0178712 A1 | 6/2017 | Van Houdt | |

OTHER PUBLICATIONS

International Search Report and Written Opinion received for PCT Application No. PCT/US17/54538, dated Jun. 29, 2018. 15 pages.

* cited by examiner

DOUBLE-GATED FERROELECTRIC FIELD-EFFECT TRANSISTOR

CROSS-REFERENCE TO RELATED APPLICATIONS

This patent application is a U.S. National Phase Application under 35 U.S.C. § 371 of International Application No. PCT/US2017/054538, filed on Sep. 29, 2017, the entire contents of which is hereby incorporated by reference herein.

BACKGROUND

Embedded dynamic random-access memory (eDRAM) and embedded static RAM (eSRAM) consume a significant area because of being transistor-pitch limited. Ferroelectric memory can be used as a nonvolatile DRAM and eDRAM replacement memory. Ferroelectric field effect transistor (FeFET) memory can suffer from degrading effects such as a poor sense margin due to factors such as the gate dielectric interface being compromised. For example, not all channel materials form ideal interfaces with ferroelectric materials.

BRIEF DESCRIPTION OF THE DRAWINGS

FIG. 8 illustrates an example computing system implemented with the integrated circuit structures or techniques disclosed herein, according to an embodiment of the present disclosure These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

According to various embodiments of the present disclosure, a ferroelectric FET (FeFET) includes two gates (such as separately controllable gates) to improve the sensing margin of the FeFET. In some embodiments, the double-gated one-transistor (1T) FeFET cell improves short-channel control (subthreshold swing) in metal oxide semiconductor FET (MOSFET) devices, such as memory devices. In some embodiments, this results in better current on-off ratio, which helps with detectability of separate states when used as a memory system.

In further detail, a ferroelectric material is organized in lattices that switch polarization between parallel and anti-parallel states on a lattice-by-lattice basis. When a sufficient number of such lattices (e.g., all or most of them) are polarized in the same state (parallel or anti-parallel), the material itself is referred to as being in that state (parallel or anti-parallel). This change in the internal polarization is brought about at positive and negative voltages known as coercive voltages or fields. This introduces different amounts of polarization and polarity of charge inside the ferroelectric. This change in the charge in the ferroelectric creates a built-in field. When used as a gate dielectric material, this ferroelectric field can be thought of as a charged capacitor. For example, a positive coercive voltage can be used to switch or program the ferroelectric material into the parallel state (e.g., all or most of the lattices in the parallel state), while a negative coercive voltage can be used to switch or program the ferroelectric material into the anti-parallel state (e.g., all or most of the lattices in the anti-parallel state). For reference, an otherwise unbiased ferroelectric material can be such a material with about half of the lattices in the parallel state and the other half in the anti-parallel state.

Further, when this ferroelectric material is in contact with the semiconductor channel in a transistor (e.g., as a gate dielectric), the threshold voltage of the transistor changes depending on the direction of polarization (parallel or anti-parallel), the value of the polarization field, and the value of the coercive field. According to some embodiments, suitable ferroelectric materials include one or more of lead zirconate titanate (PZT), hafnium zirconium oxide (HZO), barium titanate ($BaTiO_3$), lead titanate ($PbTiO_3$), and doped hafnium dioxide ($HfO_2$). The doped $HfO_2$ can include one or more of silicon-doped $HfO_2$, yttrium-doped $HfO_2$, and aluminum-doped $HfO_2$.

Single-gate FeFET techniques can be prone to problems. For example, in n-type thin-film semiconductor FeFET circuits, there can be a need for a higher effective coercive field to depolarize the ferroelectric material. Further, polarization near the contacts can often never be changed back. In addition, the read operation is slow because of low transconductance. Furthermore, the read and write operations cannot be simultaneous. In such techniques, the voltage window can suffer due to poor gate control and sub-threshold slope. In addition, there is often a need for another transistor to prevent depolarization during the read operation.

Accordingly, in one or more embodiments of the present disclosure, a ferroelectric material is incorporated in one of the gate oxide layers of a double-gate MOSFET. The two gates can be independently driven. In some embodiments, the ferroelectric material is in the top gate oxide while the bottom gate (with a linear dielectric, such as a high-κ dielectric) is used for read operations. In such embodiments, read and write operations can operate independently. Further, higher gate fields can be achieved by driving both gates concurrently (e.g., simultaneously), which can lead to boosted write fields and erase fields. In addition, the depolarization field is mitigated, as the transistor does not need to be accessed.

In one or more embodiments of the present disclosure, a double-gated FeFET is provided. In one or more embodiments of the present disclosure, a double-gated backend 1T-FeFET memory cell is provided. According to one embodiment, a ferroelectric field-effect transistor (FeFET) includes first and second gate electrodes, source and drain regions, a semiconductor region between and physically connecting the source and drain regions, a first gate dielectric between the semiconductor region and the first gate electrode, and a second gate dielectric between the semiconductor region and the second gate electrode. The first gate dielectric includes a ferroelectric dielectric. In another embodiment, a memory cell includes this FeFET, with the first gate electrode being electrically connected to a first wordline and one of the source and drain regions being electrically connected to a bitline. In yet another embodiment, a memory array includes a plurality of first wordlines extending in a first direction, a plurality of bitlines extending in a second direction crossing the first direction, and a plurality of such memory cells at crossing regions of the first wordlines and the bitlines. In each memory cell, the first wordline is a corresponding one of the first wordlines and the bitline is a corresponding one of the bitlines.

In another embodiment, an embedded memory includes a plurality of first wordlines extending in a first direction, a plurality of bitlines extending in a second direction crossing the first direction, and a plurality of embedded memory cells at crossing regions of the first wordlines and the bitlines. Each of the embedded memory cells includes a backend thin-film transistor (TFT). The backend TFT is a ferroelectric field-effect transistor (FeFET) including first and second gate electrodes, source and drain regions, a semiconductor region between and physically connecting the source and drain regions, a first gate dielectric between the semiconductor region and the first gate electrode, and a second gate dielectric between the semiconductor region and the second gate electrode. The first gate dielectric includes a ferroelectric dielectric.

General Overview

In accordance with some embodiments of the present disclosure, an eNVM memory cell includes a ferroelectric material incorporated as the gate oxide of a backend transistor, such as a backend thin-film transistor (TFT). The ferroelectric FET uses a ferroelectric material to store a bit (logical 1 or 0) in the eNVM. The reading of the memory cell can be destructive or nondestructive. Two different states (parallel or anti-parallel) of the ferroelectric FET can be sensed, for example, on a bitline. For instance, by selecting the memory cell (e.g., using a unique combination of bitline and wordline, as driven by a control circuit such as a wordline driver), amplifying the bias (e.g., using a sense amplifier) imparted by the ferroelectric FET on the bitline, and comparing the amplified sensed bias to that of an unbiased bitline, the state of the ferroelectric FET (e.g., parallel or anti-parallel) can be determined. Using a backend TFT, e.g., a TFT formed during a back end of line (BEOL) process, the front end of line (FEOL) process can be used to fabricate the memory controller (e.g., wordline drivers, sense amplifiers, and the like) logic underneath the memory array. This allows more room for the ferroelectric FETs, allowing them to continue to function as memory devices even with smaller process technologies, such as 14 nanometer (nm), 10 nm, 7 nm, 5 nm, and beyond.

Further, using a double-gated FeFET memory cell allows for flexible ways to operate the embedded memories created from such cells. For example, both gates can be independently driven (e.g., with different wordlines), allowing for such capabilities as writing to the memory cell using one wordline while reading from the memory cell using the other wordline, or writing to the memory cell using both wordlines, or reading from the memory cell using either wordline, or reading from the memory cell using both wordlines. For instance, for programming selected cells sharing the same wordline to an anti-parallel state (e.g., using corresponding bitlines to select the cells affected), a negative voltage can be supplied by the wordline whose gate is coupled to the ferroelectric dielectric, while a positive voltage can be supplied by the wordline whose gate is coupled to the non-ferroelectric dielectric. This creates a bigger negative bias in the selected cells than would be possible just driving the wordline coupled to the ferroelectric dielectrics.

Architecture and Methodology

Figure 1:
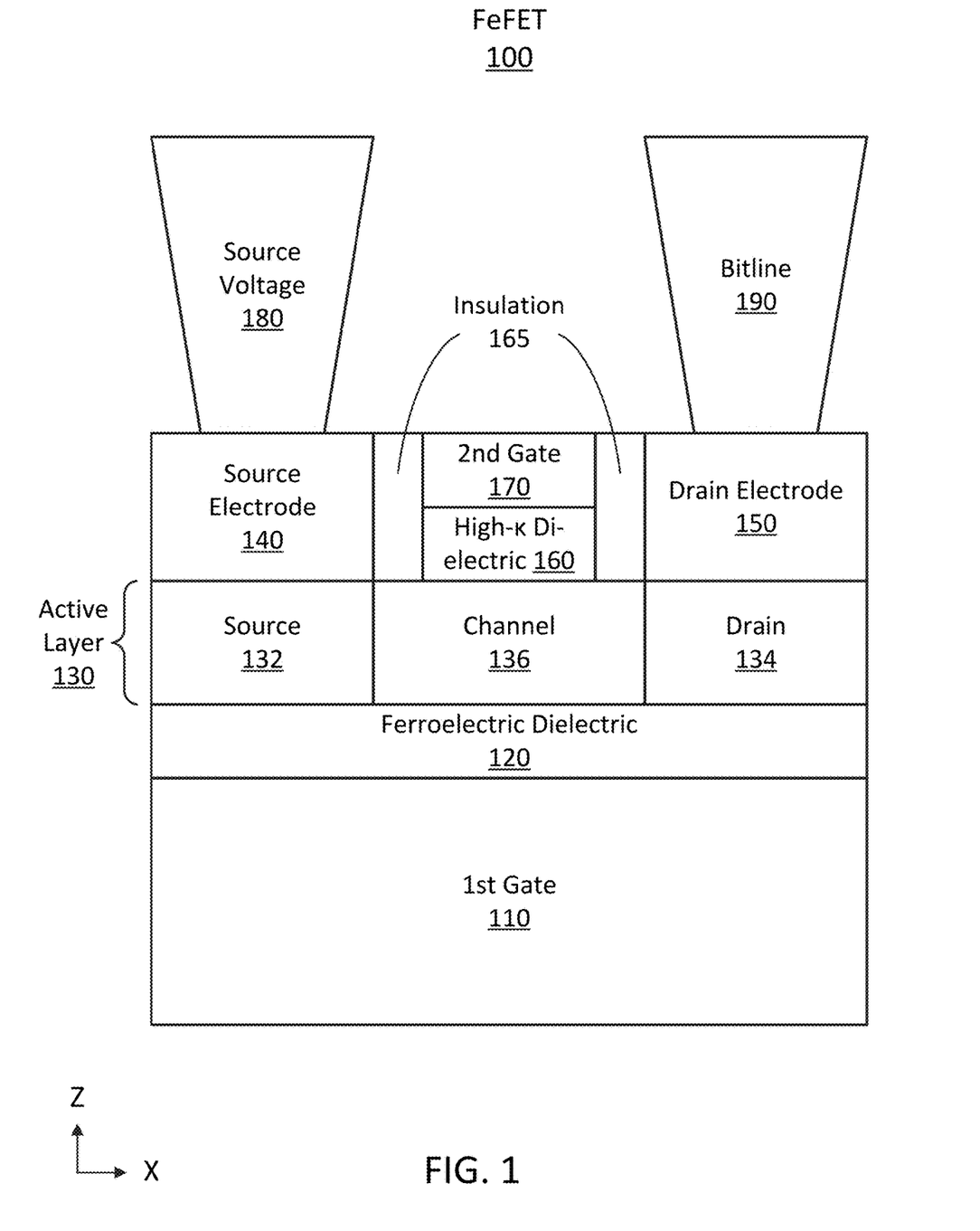
FIG. 1 is a cross-sectional view of an example ferroelectric field effect transistor (FeFET), according to an embodiment of the present disclosure.

FIG. 1 is a cross-sectional (X-Z) view of an example ferroelectric field effect transistor (FeFET) 100, according to an embodiment of the present disclosure. Throughout, the z-axis represents a vertical dimension (e.g., perpendicular to an integrated circuit substrate, while the x- and y-axes represent horizontal dimensions (e.g., parallel to the wordline and bitline directions, respectively). The components of FeFET 100 can be fabricated using semiconductor fabrication techniques, such as deposition and photolithography. The components of FeFET 100 can be part of a backend process, such as the back end of line (BEOL) process of a semiconductor integrated circuit. As such, the components of FeFET 100 can be fabricated as part of, or concurrently with, the metal interconnection layers (such as the upper or middle metal interconnection layers) of a semiconductor fabrication process. In some other embodiment, the components of FeFET are fabricated as a front end of line (FEOL) process.

In example embodiments, fabrication of the components of FeFET 100 can be part of the metal 4 (interconnect) layer of a BEOL process, using mostly a custom process (e.g., separate from the other metal 4 features) to form the components. Referring to FIG. 1, a first gate (or first gate electrode) 110 is formed. The first gate 110 is conductive, and can represent one or more layers or features for supplying a first gate signal to the FeFET 100. For instance, the first gate 110 can include a first wordline (such as a first wordline made of copper (Cu) or aluminum (Al)) to supply a first gate signal from a first wordline driver, along with diffusion barriers and a first metal gate electrode for supplying the first gate signal to the proximity of the channel region of the FeFET 100.

For example, the first gate 110 can include thin-film layers such as one or more first gate electrode layers (e.g., diffusion barrier and first metal gate layers). The diffusion barrier can be a metal- or copper-diffusion barrier (e.g., a conductive material to reduce or prevent the diffusion of metal or copper from a wordline into the metal first gate 110 while still maintaining an electrical connection between the first wordline and the metal first gate 110) on the first wordline such as tantalum nitride (TaN), tantalum (Ta), titanium zirconium nitride (e.g., $Ti_xZr_{1-x}N$, such as X=0.53), titanium nitride (e.g., TiN), titanium tungsten (TiW), combination (such as a stack structure of TaN on Ta), or the like.

For instance, the diffusion barrier can include a single- or multi-layer structure including a compound of tantalum (Ta) and nitrogen (N), such as TaN or a layer of TaN on a layer of Ta. In some embodiments, a layer of etch-resistant material (e.g., etch stop) such as silicon nitride (e.g., $Si_3N_4$) or silicon carbide (e.g., SiC) is formed over the first wordline with vias for a metal (or copper) diffusion barrier film such as TaN or a TaN/Ta stack. The first metal gate can be a conductive material on the diffusion barrier, such as metal, conductive metal oxide or nitride, or the like. For example, in one embodiment, the first metal gate is titanium nitride (TiN). In another embodiment, the first metal gate is tungsten (W).

The first gate 110 is covered with a ferroelectric dielectric 120 corresponding to an active (semiconductor) layer 130 (or to a channel area of the active layer) of the FeFET 100. The ferroelectric dielectric 120 can be a ferroelectric material such as one or more of lead zirconate titanate (PZT), hafnium zirconium oxide (HZO), barium titanate ($BaTiO_3$), lead titanate ($PbTiO_3$), and doped hafnium dioxide ($HfO_2$). The doped $HfO_2$ can include one or more of silicon-doped $HfO_2$, yttrium-doped $HfO_2$, and aluminum-doped $HfO_2$.

The semiconductive active layer 130 is formed over the ferroelectric dielectric 120. The active layer 130 can be formed in a backend process, for example, from one or more of indium gallium zinc oxide (IGZO), indium zinc oxide (IZO), amorphous silicon (a-Si), low-temperature polycrystalline silicon (LTPS), and amorphous germanium (a-Ge). For example, the active layer 130 can be IGZO or the like in contact with a bitline (such as bitline 190, e.g., at a drain region 134 of the active layer 130) and a source voltage 180 (e.g., at a source region 132 of the active layer 130), with a semi-conductive channel region 136 between the drain region 134 and the source region 132. Such an active layer channel 136 may include only majority carriers in the thin film. Accordingly, the active layer channel 136 may require high bias (as supplied by the first wordline, diffusion barrier film, and first metal gate) to activate. In addition to IGZO, in some embodiments, the active layer 130 is one of a variety of polycrystalline semiconductors, including, for example, zinc oxynitride (ZnON, such as a composite of zinc oxide (ZnO) and zinc nitride ($Zn_3N_2$), or of ZnO, $ZnO_xN_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like.

In some embodiments, the active layer 130 is formed from first type channel material, which may be an n-type channel material or a p-type channel material. An n-type channel material may include indium tin oxide (ITO), indium gallium zinc oxide (IGZO), indium zinc oxide (IZO), aluminum-doped zinc oxide (AZO), amorphous silicon (a-Si), zinc oxide (e.g., ZnO), amorphous germanium (a-Ge), polycrystalline silicon (polysilicon or poly-Si), poly-germanium (poly-Ge), or poly-III-V like indium arsenide (InAs). On the other hand, a p-type channel material may include amorphous silicon, zinc oxide, amorphous germanium, polysilicon, poly germanium, poly-III-V like InAs, copper oxide (e.g., CuO), or tin oxide (e.g., SnO). The channel region 146 have a thickness in a range of about 10 nm to about 100 nm.

As mentioned, the active layer 130 can be divided into three different regions, namely the source and drain regions 132 and 134 with the channel region 136 between and physically connecting the source and drain regions 132 and 134. The active layer 130 forms a transistor device with the first gate 110 and ferroelectric dielectric 120. When a gate signal is supplied to the first gate 110, the active layer 130 becomes conductive, and current flows between the source and drain regions 132 and 134 via the channel region 136.

Further, in some embodiments (such as n-channel logic), when a positive coercive voltage is applied to the first gate 110 (with respect to the channel 136), the ferroelectric dielectric 120 becomes oriented in the parallel state. As such, the channel region 136 behaves as if a small positive voltage is always being applied from the ferroelectric dielectric. This allows the first gate 110 to drive the transistor with less voltage than when the ferroelectric dielectric 120 is unbiased (e.g., 50% parallel, 50% anti-parallel) or in the anti-parallel state. The opposite phenomenon takes place when a negative coercive voltage is applied to the first gate 110 (with respect to the channel 136). Then the ferroelectric dielectric 120 becomes oriented in the anti-parallel state, at which point more voltage from the first gate 110 is needed to drive the transistor than when the ferroelectric dielectric 120 is unbiased or in the parallel state. In p-channel logic, a similar phenomenon takes place, with the polarities reversed, as will be appreciated in light of this disclosure. For ease of description, n-channel logic will be discussed primarily throughout.

Above the active layer 130, a second gate structure is formed. In FIG. 1, a gate dielectric 160 is formed on the channel region 136. The gate dielectric 160 can be a high-κ dielectric material such as hafnium dioxide ($HfO_2$). The gate dielectric 160 can be thin, such as 4 nanometers (nm). In some embodiments, the gate dielectric 160 is in a range of 3 nm to 7 nm. In some embodiments, the gate dielectric 160 is in a range of 2 nm to 10 nm. In some embodiments, the gate dielectric 160 can be silicon dioxide ($SiO_2$), silicon nitride (e.g., $Si_3N_4$), hafnium dioxide ($HfO_2$) or other high-κ material, or a multi-layer stack including a first layer of $SiO_2$ and a second layer of a high-κ dielectric such as $HfO_2$ on the $SiO_2$. Any number of gate dielectrics can be used, as will be appreciated in light of the present disclosure. For example, in one embodiment, the gate dielectric 160 is a layer of $SiO_2$. In another embodiment, the gate dielectric 160 is a stack (e.g., two or more layers) of $HfO_2$ on $SiO_2$.

Above the gate dielectric 160, a second gate (such as a second gate electrode) 170 is formed. The second gate 170 can be thin, as with the first metal gate of the first gate 110, and can be constructed of similar materials or structures. The second gate 170 can be electrically connected to a second wordline that supplies a second gate signal (e.g., from a second wordline driver). In some embodiments, the second gate 170 can drive the transistor independently of the first gate 110. For example, the second gate 170 can be electrically separated from the first gate 110, and the second wordline can be electrically separated from the first wordline, such that the second gate 170 can drive read operations of the ferroelectric dielectric (e.g., by driving sensing currents), while the first gate 110 drives write operations. In some other embodiments, the second gate 170 is used to assist the first gate 110 (e.g., to apply a reverse bias when programming the ferroelectric dielectric 120, or supplementing the first gate signal to better activate the transistor, such as when sensing the ferroelectric dielectric 120). In some embodiments, the first gate 110 is used to write the ferroelectric dielectric 120, and the second gate 170 is used to read the stored state of the ferroelectric dielectric 120.

In addition, above the active layer 130, a source electrode 140 is formed and electrically connected to the source region 132, a drain electrode 150 is formed and electrically connected to the drain region 134, and insulation 165 is formed between the source electrode 140 and the gate dielectric 160 and second gate 170 stack, and between the drain electrode 150 and the gate dielectric 160 and second gate 170 stack, to electrically insulate the source and drain electrodes 140 and 150 from the gate dielectric 160 and second gate 170 stack. In some embodiments, the insulation 165 is an etch resistant insulation material, such as silicon nitride (e.g., $Si_3N_4$) or silicon carbide (e.g., SiC).

The source and drain electrodes 140 and 150 can be metal, such as metal interconnect layer material (e.g., Cu, Al, or tungsten (W)). In some embodiments, the source and drain electrodes 140 and 150 are similar or the same materials as those used to form the second gate 170. The FeFET 100 acts as a memory (by programming the ferroelectric dielectric 120) and as a switch, electrically connecting the source and drain electrodes 140 and 150 in response to a gate signal, such as a first gate signal being supplied to the first gate 110 or a second gate signal being supplied to the second gate 170.

A source voltage supply 180 (e.g., further metal interconnect material) such as a source supply line or plate is formed above and electrically connected to the source electrode 140. For example, the source voltage 180 can be a ground voltage or other fixed voltage, or can be a programmable voltage used in conjunction with the bitline 190 in the read or write operations. Further, the bitline 190 (e.g., further metal interconnect material) is formed above and electrically connected to the drain electrode 150. The bitline 190 is used in combination with the source voltage 180 to sense the state of the ferroelectric dielectric 120 when used as a memory device. In other embodiments, the FeFET 100 acts as a switch, controlling an electrical current between the bitline 190 and the source voltage 180. In some embodiments, the roles of the source and drain electrodes 140 and 150 are reversed, the source electrode being connected to the bitline 190 and the drain electrode being connected to the source voltage (or drain voltage) 180.

Figure 2:
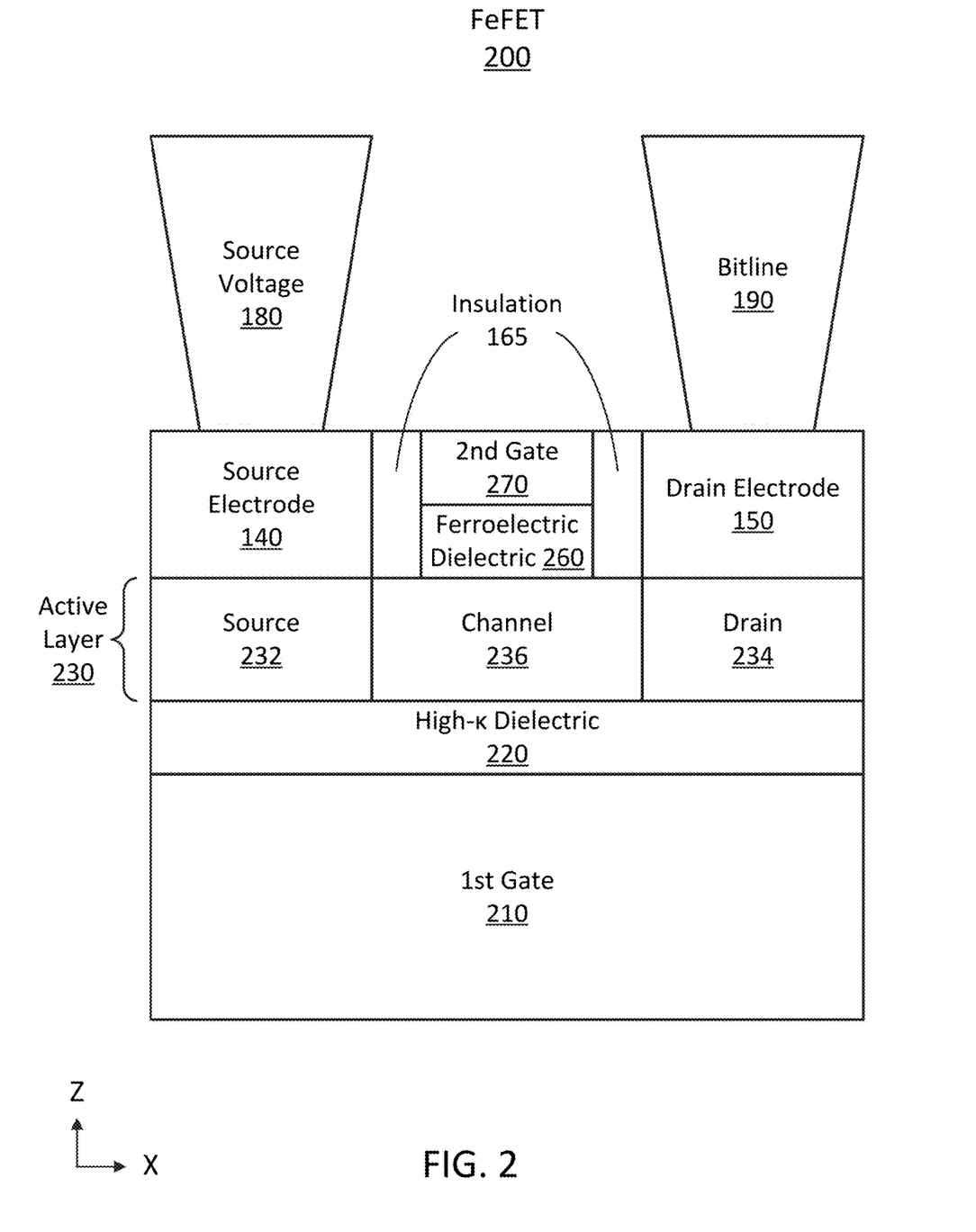
FIG. 2 is a cross-sectional view of an example FeFET, according to another embodiment of the present disclosure.

FIG. 2 is a cross-sectional (X-Z) view of an example FeFET 200, according to another embodiment of the present disclosure. Here, the FeFET 200 has a similar structure to that of FeFET 100 in FIG. 1, but the roles of the gate dielectrics are reversed. Accordingly, some of the components are the same or similar between the two embodiments, and are numbered the same. For ease of discussion, their descriptions may not be repeated. Further, the materials for similarly numbered or named structures can be substantially the same between the two embodiments.

For example, in FeFET 200, the first gate 210 can be similar to the first gate 110 in FeFET 100, with appropriate accommodations for forming the gate dielectric 220 (such as a high-κ dielectric) on the first gate 210 (e.g., material compatibilities and the like). Further, the first gate 210 in FeFET 200 has an operation role a lot closer to that of the second gate 170 in FeFET 100 than to the first gate 110 in FeFET 100, given the switched locations of the ferroelectric dielectric and the high-κ dielectric between the two embodiments. Accordingly, the role of the first wordline driver (for supplying the first gate signal to the first wordline and to the first gate 210) in FeFET 200 may also be reversed compared to that of FeFET 100.

Similar to FeFET 100, FeFET 200 has an active layer 230 on the gate dielectric 220. The active layer 230 includes source and drain regions 232 and 234, and a semiconductive channel region 236 between and physically connecting the source and drain regions 232 and 234. The ferroelectric dielectric 260 is formed above the channel 236 (as part of the top gate structure), with the second gate 270 formed on the ferroelectric dielectric 260. The second gate 270 can be driven by a second wordline. The second wordline can be in a higher metal interconnect layer than the first wordline (that drives the first gate 210). For example, the first and second wordlines may extend in a wordline direction in the fourth and sixth metal interconnect layers, respectively, while the bitline (and possibly a source line) extend in a bitline direction in the fifth metal interconnect layer (between and crossing first and second wordlines). The second wordline can be electrically separated from the first wordline.

Figure 3:
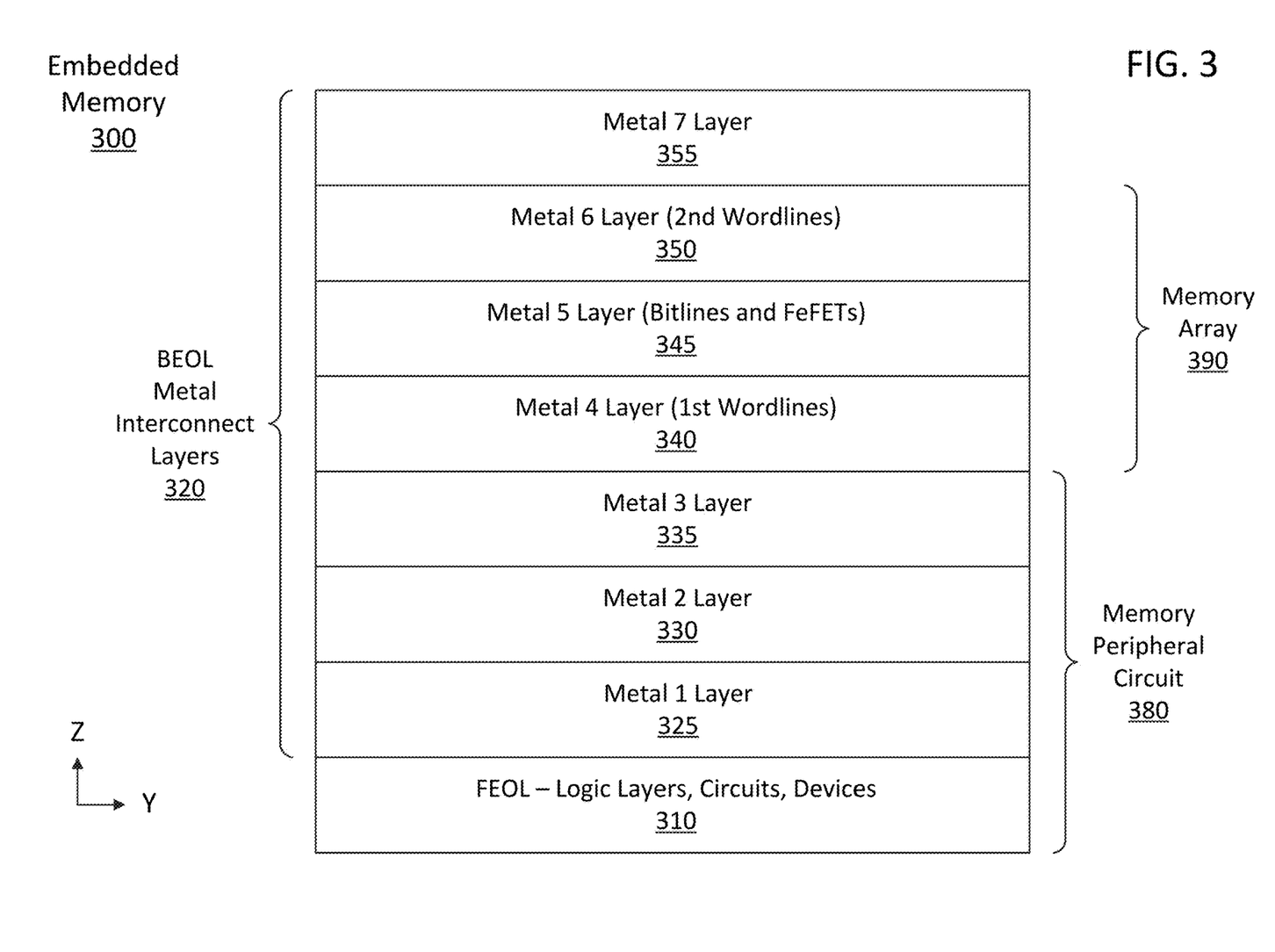
FIG. 3 is a cross-sectional view of an example embedded memory, according to an embodiment of the present disclosure.

FIG. 3 is a cross-sectional (Y-Z) view of an example embedded memory 300, according to an embodiment of the present disclosure. FIG. 3 illustrates the Y and Z dimensions (width and height, respectively), the X dimension (length) extending into and out of the Y-Z plane. The embedded memory 300 includes an FEOL 310 that includes most of the various logic layers, circuits, and devices to drive and control the integrated circuit (e.g., chip) being fabricated with the embedded memory 300. As illustrated in FIG. 3, the embedded memory 300 also includes a BEOL 320 including, in this case, seven metal interconnection layers (namely, metal 1 layer 325, metal 2 layer 330, metal 3 layer 335, metal 4 layer 340, metal 5 layer 345, metal 6 layer 350, and metal 7 layer 355) to interconnect the various inputs and outputs of the FEOL 310.

Generally speaking, each of the metal 1 layer 325 through the metal 7 layer 355 includes a via portion and an interconnect portion located above the via portion, the interconnect portion being for transferring signals along metal lines extending in the X or Y directions, the via portion being for transferring signals through metal vias extending in the Z direction (such as to the next lower metal layer underneath). Accordingly, vias connect metal structures (e.g., metal lines or vias) from one metal layer to metal structures of the next lower metal layer. Further, each of the metal 1 layer 325 through the metal 7 layer 355 includes a pattern of conductive metal, such as copper (Cu) or aluminum (Al), formed in a dielectric medium or interlayer dielectric (ILD), such as by photolithography.

In addition, the embedded memory 300 is further divided into a memory array 390 (e.g., an eNVM memory array) built in the metal 4 layer 340 through the metal 6 layer 350 and including the FeFETs (in the metal 5 layer 345) as well as the first wordlines (e.g., row selectors, for driving the first gates, in the metal 4 layer 340), second wordlines (e.g., also row selectors, for driving the second gates, in the metal 6 layer 350), and the bitlines (e.g., column selectors, in the metal 5 layer 345) and possible source lines (also in the metal 5 layer 345) making up the eNVM memory cells, and a memory peripheral circuit 380 built in the FEOL and metal 1 layer 325 through metal 3 layer 335 to control (e.g., access, store, refresh) the memory array 390.

Compared to other techniques that locate such a memory control circuit in the same layers as the memory array but in a different macro (or X-Y) area of the integrated circuit than the memory array (such as at a periphery of the memory array), the embedded memory 300 locates the memory peripheral circuit 380 below the memory array 390 (e.g., in the same X-Y area). This saves valuable X-Y area in the finished integrated circuit. In further detail, the embedded memory 300 embeds the FeFETs (e.g., backend TFTs) in the metal 5 layer 345 (such as the via portion of the metal 5 layer 345). For example, the metal 4 layer 340 can contain the first wordlines extending in the X direction to select a row of memory cells (bits), the metal 5 layer 345 can contain the bitlines extending in the Y direction to sense each of the memory cells (bits) in the selected row, and the metal 6 layer 350 can contain the second wordlines extending in the X direction to further process the selected row (e.g., to write, assist in writing, read, or assist in reading memory data to the ferroelectric dielectric of any of the memory cells in the selected row). The FeFETs can be fabricated in the metal 5 layer 345, above the wordlines (that serve as or connect to the gate electrodes or contacts) and below the bitlines (that serve as the drain electrodes or contacts, or in some embodiments, serve as the source electrodes or contacts). For example, the FeFET can have the first transistor gate below the thin-film layer (that can be formed at the bottom of the metal 5 layer 345, such as in the via portion) and source and drain contacts above the thin-film layer.

In further detail, in some embodiments, the lower or first metal gate of the FeFET in each memory cell can be connected to a continuous metal 4 line below, such as a copper (Cu)-based metal line, which provides much lower resistance compared to gate lines formed in the lower (e.g., FEOL) portions of the integrated circuit. The continuous metal 4 line is used as the first wordline of the memory array, and is covered by diffusion barriers or diffusion barrier layers including dielectric layers, such as silicon nitride (e.g., $Si_3N_4$), silicon carbide (e.g., SiC), or the like, with vias filled with metal-diffusion barrier films like tantalum nitride (TaN), tantalum (Ta), titanium zirconium nitride (e.g., $Ti_XZr_{1-X}N$, such as X=0.53), titanium nitride (e.g., TiN), titanium tungsten (TiW), or the like. A first metal gate layer covers the diffusion barrier film-filled vias, which electrically connect the copper (Cu) wordline to the metal gates of the selector TFTs, the diffusion barrier film preventing or helping to prevent the diffusion or migration of copper (Cu) from the first wordline to the rest of the selector TFTs. An active thin-film layer (e.g., indium gallium zinc oxide, or IGZO) and then source and drain contacts above the thin-film layer use the metal 5 layer 345. The space between the source and drain contacts determines the gate length of the selector transistor.

Figure 4:
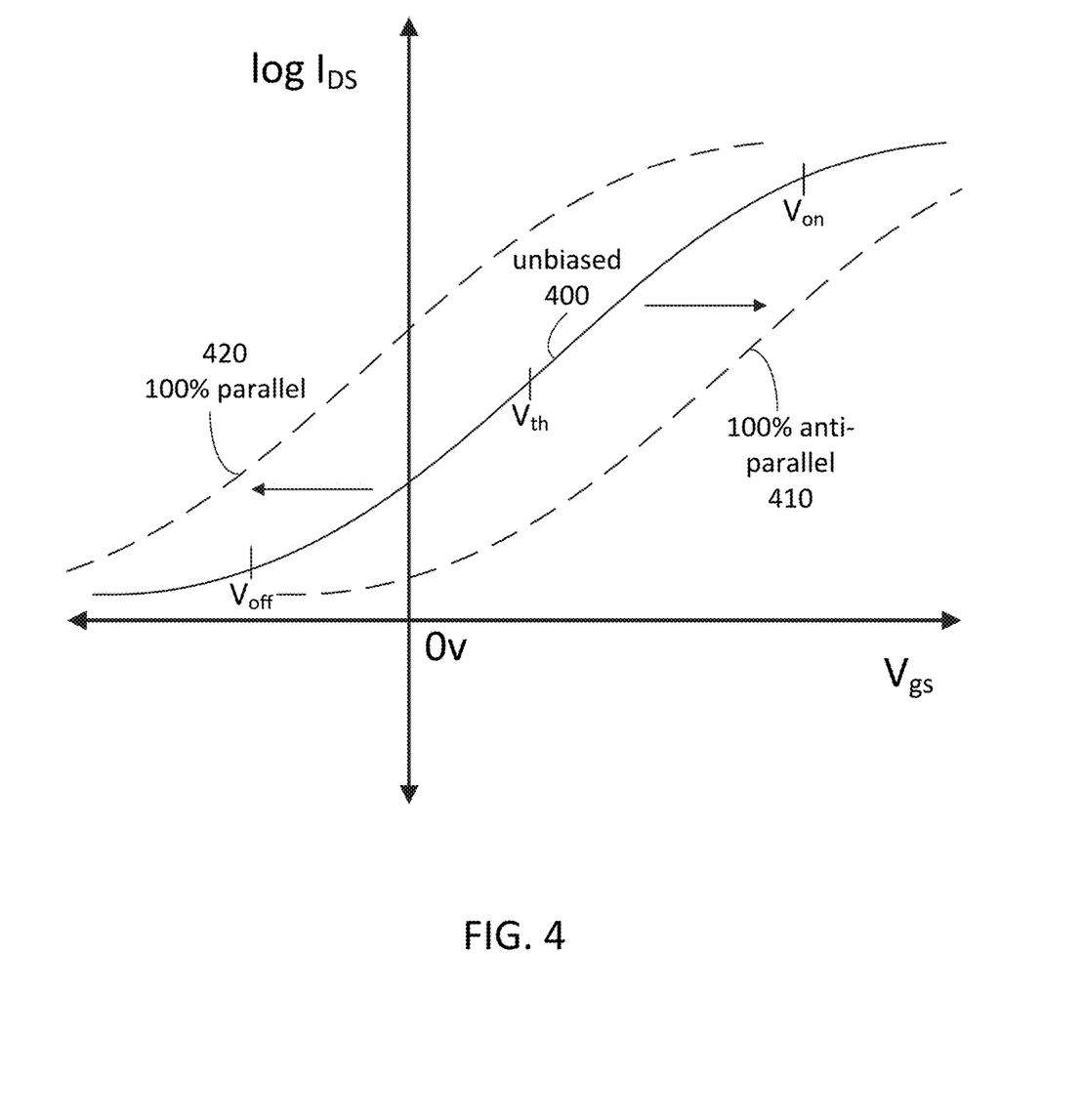
FIG. 4 is an example voltage curve comparison for driving a FeFET in three different states, according to an embodiment of the present disclosure.

FIG. 4 is an example voltage curve comparison for driving a FeFET in three different states, according to an embodiment of the present disclosure. Three different curves are illustrated in FIG. 4: unbiased curve 400, 100% parallel curve 420, and 100% anti-parallel curve 410. The x-axis of FIG. 4 tracks the gate-to-source voltage $V_{gs}$ of the FeFET (increasing to the right, with 0 volts at the intersection with the y-axis), while the y-axis tracks the base 10 logarithm of the corresponding drain-to-source current $I_{DS}$ corresponding to the gate voltage $V_{gs}$. Three different voltages are identified on the unbiased curve 400 (and exist in similar locations on the other two curves): the gate off voltage $V_{off}$ (e.g., the voltage at which the FeFET is effectively off, such as when supplying minimal current), the gate on voltage $V_{on}$ (e.g., the voltage at which the FeFET is fully on, such as when supplying maximal current), and the threshold voltage $V_{th}$ (e.g., the voltage at which the channel region between the source and drain regions becomes a conductive channel).

In FIG. 4, the unbiased curve 400 represents the normal operation of a MOSFET (e.g., an n-channel MOSFET). However, the orienting of the ferroelectric dielectric in the FeFET has the effect of shifting the unbiased curve 400 either left or right, depending on the orientation of the ferroelectric lattices. For example, when the lattices are 100% parallel, it has the effect of shifting the voltage curve to the left (to the 100% parallel curve 420), similar to a positive gate voltage being permanently applied to the gate electrode. Likewise, when the lattices are 100% anti-parallel, it has the effect of shifting the voltage curve to the right (to the 100% anti-parallel curve 410), similar to a negative gate voltage being permanently applied to the gate electrode.

Figure 5:
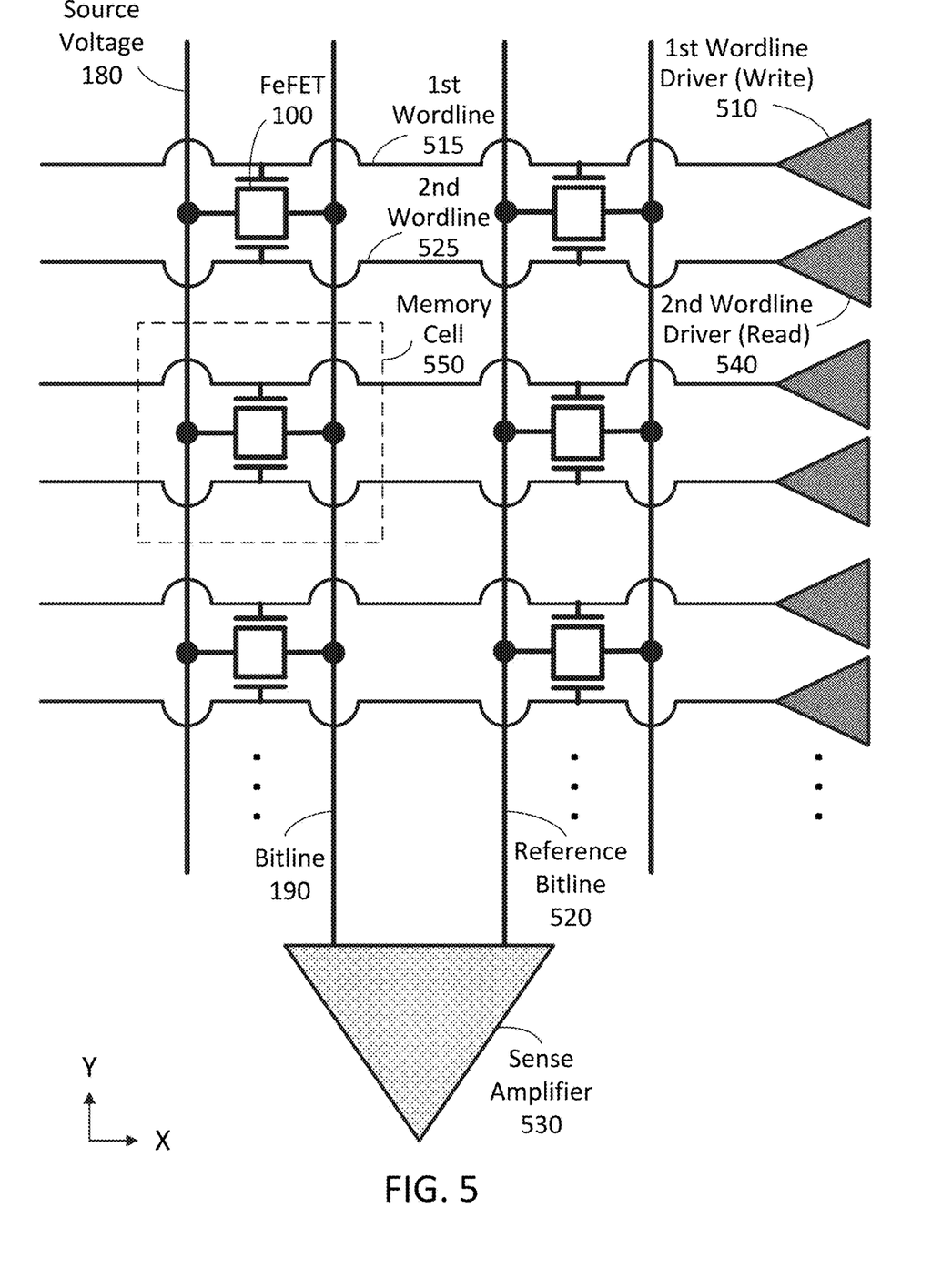
FIG. 5 is a schematic plan view of an example embedded memory configuration, according to an embodiment of the present disclosure.

FIG. 5 is a schematic plan (X-Y) view of an example embedded memory configuration, according to an embodiment of the present disclosure. The memory array configuration of FIG. 5 includes memory cells 550 at crossing regions of first wordlines 515, second wordlines 525, and bitlines 190 (e.g., each memory cell 550 being driven by a unique set of first and second wordlines 515 and 525, and bitline 190). Each memory cell 550 includes a FeFET 100. Each first wordline 515 is selected by a corresponding first wordline driver 510 and each second wordline 525 is selected by a corresponding second wordline driver 540, while the corresponding bitlines 190 are used to sense the state of the ferroelectric material (e.g., parallel or anti-parallel) in the FeFET 100 of each of the corresponding bits of the selected first wordline 510 and second wordline 540. In some embodiments, a reference column of memory cells provides a corresponding reference signal (e.g., halfway between a logic low value and a logic high value) over a reference bitline 520 concurrently with the sensing of the desired bit on the bitline 190. These two values are compared, by a sense amplifier 530, which determines whether the desired bit is a logic high value (e.g., 1) or a logic low value (e.g., 0).

The memory cells 550 can be embedded in BEOL layers (such as the higher metal interconnect layers of the BEOL) while the peripheral circuits responsible for memory operation, including the read sense amplifiers 530 (and other bitline driver circuits) and first and second wordline driver circuits 510 and 540, are placed below the memory array (e.g., in the FEOL and lower metal interconnect layers of the BEOL) to reduce area of the embedded memory.

Figure 6A:
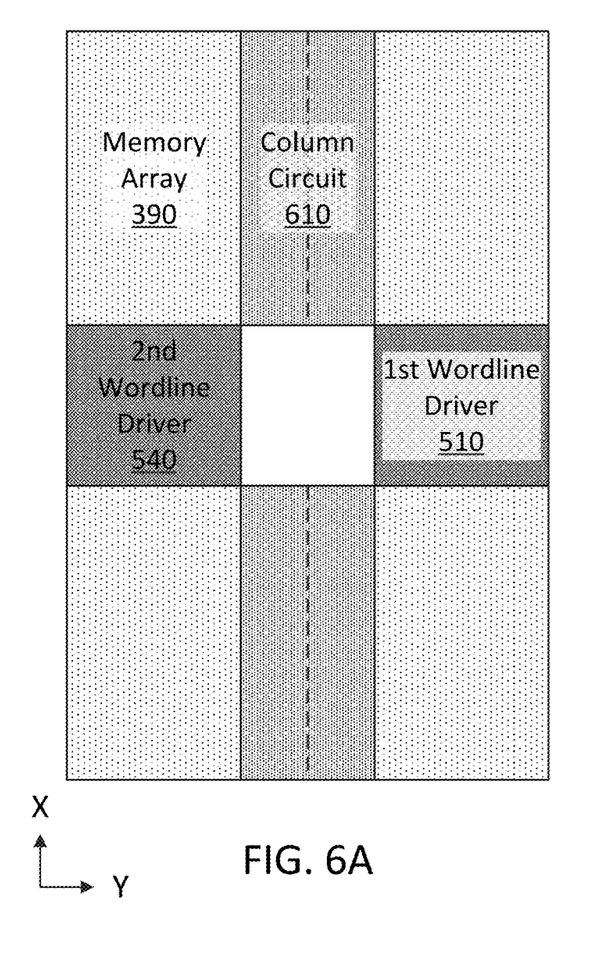
FIG. 6A is a plan view of an example layout of an embedded memory without overlap of the memory array and memory peripheral circuit.
Figure 6B:
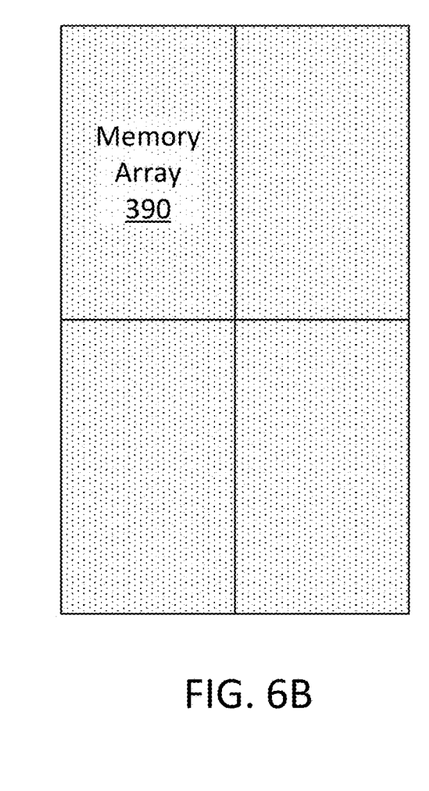
FIGS. 6B-6C are plan views of an example layout of an embedded memory with overlap of the memory array and memory peripheral circuit, according to an embodiment of the present disclosure.
Figure 6C:
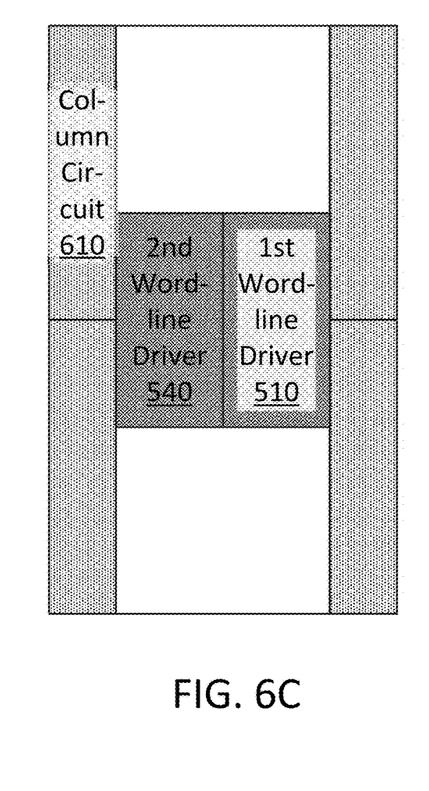

FIG. 6A is a plan (Y-X) view of an example layout of an embedded memory without overlap of the memory array 390 and memory peripheral circuit (illustrated as first and second wordline drivers 510 and 540, and column circuits 610). FIGS. 6B-6C are plan (Y-X) views of an example layout or floorplan of an embedded memory with overlap of the memory array 390 and memory peripheral circuits 510, 540, and 610, according to an embodiment of the present disclosure.

The column circuits 610 (or bitline drivers) include devices such as read (bitline) sense amplifiers 530 and precharging circuits. FIG. 6A shows the circuits spread out (e.g., occupying FEOL macro area or CMOS logic transistor area) and without overlap. By contrast, FIG. 6B shows the memory array 390 occupying the higher metal interconnection layers of the BEOL 320 (as illustrated in FIG. 3) and FIG. 6C shows the memory peripheral circuits 510, 540, and 610 occupying the FEOL 310 and lower metal interconnection layers of the BEOL 320 underneath the memory array 390 (as illustrated in FIG. 3). Since more than 35% of the embedded memory macro area can be consumed by the peripheral (memory control) circuits, substantial savings of X-Y macro area can be saved by fabricating the memory arrays above the memory peripheral circuits, as in one or more embodiments of the present disclosure. Put another way, according to some embodiments of the present disclosure, an embedded memory is provided with memory cells only using space in the upper metal layers (e.g., metal 4 layer and above), the peripheral circuits being moved below the memory cells (e.g., in metal 3 layer and below, including the FEOL) and substantially reduce the memory area.

Figure 7:
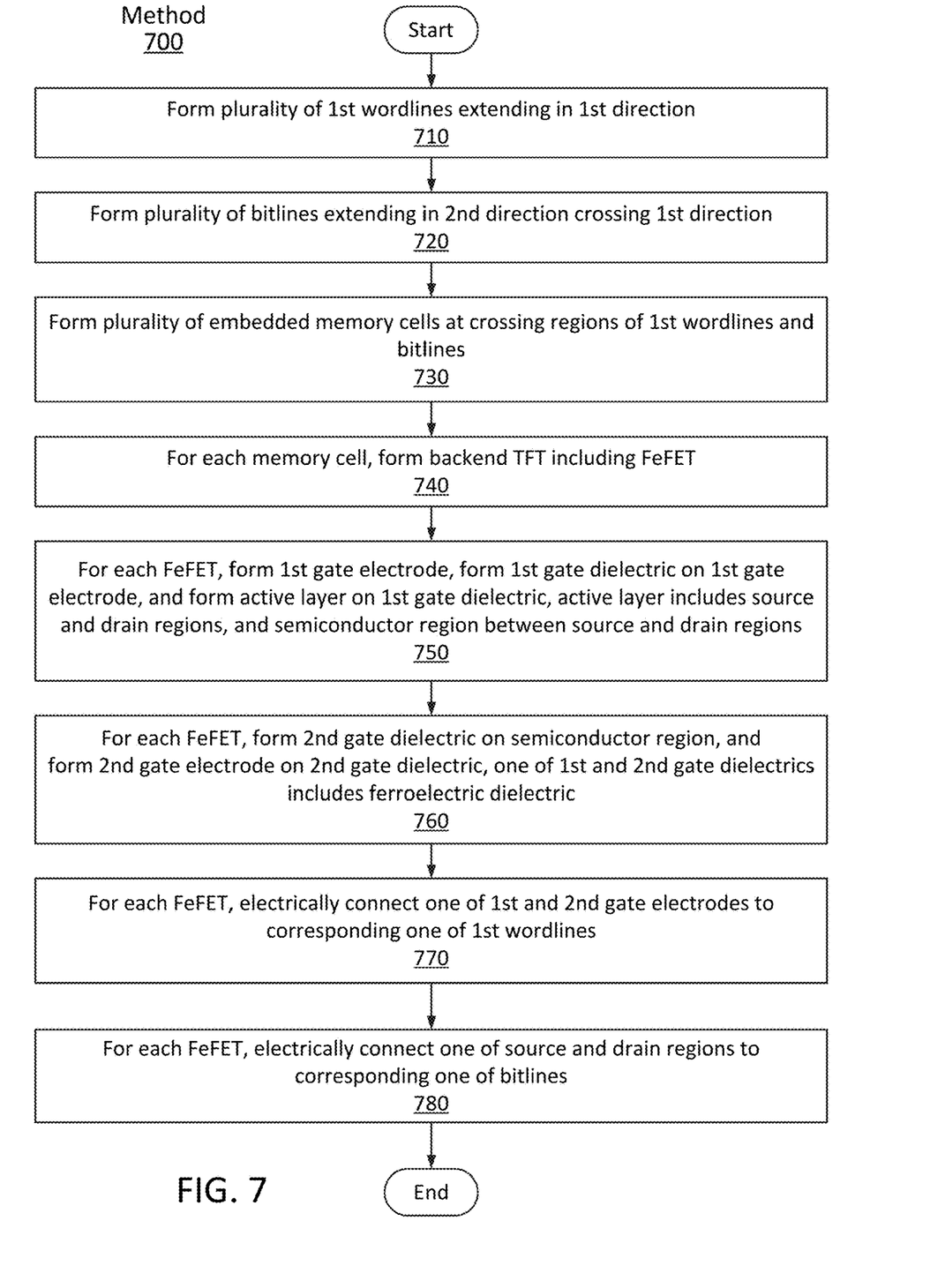
FIG. 7 illustrates an example method of fabricating a FeFET-based embedded memory, according to an embodiment of the present disclosure.

FIG. 7 illustrates an example method 700 of fabricating a FeFET-based embedded memory (e.g., an eNVM), according to an embodiment of the present disclosure. This and other methods disclosed herein may be carried out using integrated circuit fabrication techniques such as photolithography as would be apparent in light of the present disclosure. The corresponding nonvolatile memory cell and embedded memory including the memory cells may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal), either directly or indirectly (such as through one or more conductive layers in between).

Referring to FIG. 7 (with specific example references to the structures of FIGS. 1-6) method 700 includes forming 710 a plurality of first wordlines (such as first wordlines 515) extending in a first direction (such as an X-direction), forming 720 a plurality of bitlines (such as bitlines 190) extending in a second direction (such as a Y-direction) crossing the first direction, and forming 730 a plurality of embedded memory cells (such as memory cells 550) at crossing regions (see FIG. 5) of the first wordlines and the bitlines. The method 700 further includes, for each embedded memory cell, forming 740 a backend TFT including a FeFET (such as FeFET 100). The method 700 further includes, for each FeFET, forming 750 a first gate electrode (such as first gate 110), forming a first gate dielectric (such as ferroelectric 120) on the first gate electrode, and forming an active layer (such as active layer 130) on the first gate dielectric, the active layer including source and drain regions (such as source and drain regions 132 and 134), and a semiconductor region (such as channel region 136) between the source and drain regions.

The method 700 further includes, for each FeFET, forming 760 a second gate dielectric (such as high-κ dielectric 160) on the semiconductor region, and forming a second gate electrode (such as 2nd gate 170) on the second gate dielectric. One of the first and second gate dielectrics includes a ferroelectric dielectric. The method 700 further includes electrically connecting 770 the one of the first and second gate electrodes to a corresponding one of the first wordlines, and electrically connecting 780 one of the source and drain regions to a corresponding one of the bitlines.

While the above example methods appear as a series of operations or stages, it is to be understood that there is no required order to the operations or stages unless specifically indicated. For example, in various embodiments of method 700, for each memory cell, the electrically connecting 770 of the one of the first and second gate electrodes to a corresponding one of the first wordlines can take place before, during, or after the electrically connecting 780 of the one of the source and drain regions to a corresponding one of the bitlines.

Example System

Figure 8:
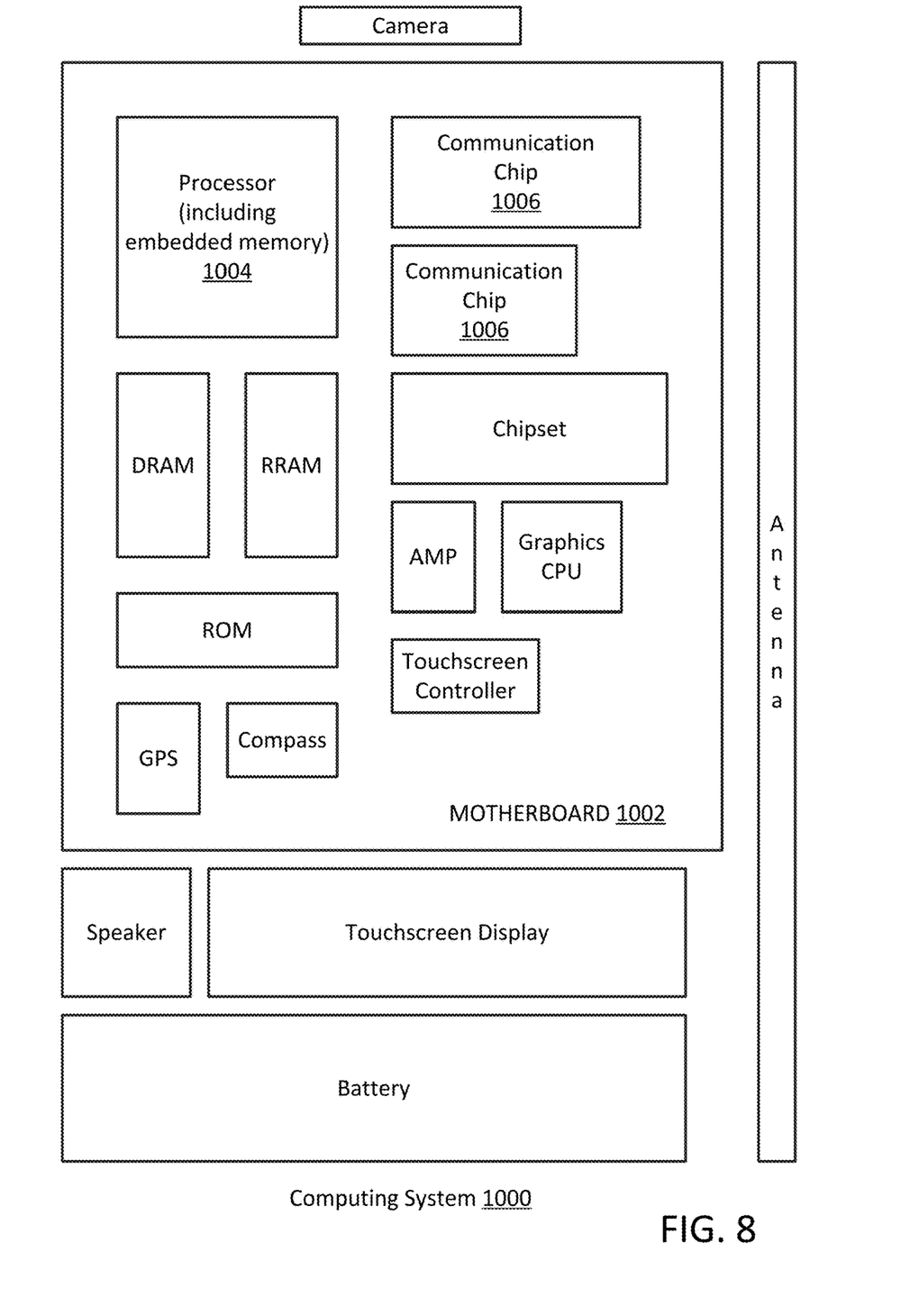

FIG. 8 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

FURTHER EXAMPLE EMBODIMENTS

The following examples pertain to further embodiments, from which numerous permutations and configurations will be apparent.

Example 1 is a ferroelectric field-effect transistor (FeFET) including: first and second gate electrodes; source and drain regions; a semiconductor region between and physically connecting the source and drain regions; a first gate dielectric between the semiconductor region and the first gate electrode, the first gate dielectric including a ferroelectric dielectric; and a second gate dielectric between the semiconductor region and the second gate electrode.

Example 2 includes the FeFET of Example 1, where the first and second gate electrodes are electrically separated.

Example 3 includes the FeFET of any of Examples 1-2, where the semiconductor region includes one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

Example 4 includes the FeFET of Example 3, where the semiconductor region includes one or more of IGZO, IZO, a-Si, LTPS, and a-Ge.

Example 5 includes the FeFET of any of Examples 1-4, where the ferroelectric dielectric includes one or more of lead zirconate titanate (PZT), hafnium zirconium oxide (HZO), barium titanate (BaTiO$_3$), lead titanate (PbTiO$_3$), and doped hafnium dioxide (HfO$_2$).

Example 6 includes the FeFET of Example 5, where the doped HfO$_2$ includes one or more of silicon-doped HfO$_2$, yttrium-doped HfO$_2$, and aluminum-doped HfO$_2$.

Example 7 includes the FeFET of any of Examples 1-6, where the second gate dielectric includes a high-κ dielectric.

Example 8 includes the FeFET of Example 7, where the high-κ dielectric includes hafnium dioxide (HfO$_2$).

Example 9 includes the FeFET of Example 8, where the second gate dielectric has a thickness between 2 and 10 nanometers (nm).

Example 10 is a memory cell including the FeFET of any of Examples 1-9, the first gate electrode being electrically connected to a first wordline and one of the source and drain regions being electrically connected to a bitline.

Example 11 includes the memory cell of Example 10, where the second gate electrode is electrically connected to a second wordline electrically separated from the first wordline.

Example 12 is a memory array including a plurality of first wordlines extending in a first direction, a plurality of bitlines extending in a second direction crossing the first direction, and a plurality of memory cells at crossing regions of the first wordlines and the bitlines, the memory cells including a first memory cell and a second memory cell, each of the first and second memory cells having a structure of the memory cell of any of Examples 10-11, with the first wordline being a corresponding one of the first wordlines and the bitline being a corresponding one of the bitlines.

Example 13 includes the memory array of Example 12, further including a plurality of second wordlines extending in the first direction and electrically separated from the first wordlines, where the second gate electrode in each of first and second memory cells is electrically connected to a corresponding one of the second wordlines.

Example 14 is a backend thin-film transistor (TFT) including the FeFET of any of Examples 1-9, the backend TFT being electrically connected to a frontend circuit.

Example 15 is an embedded memory cell including the backend TFT of Example 14, the first gate electrode being electrically connected to a first wordline and one of the source and drain regions being electrically connected to a bitline.

Example 16 includes the embedded memory cell of Example 15, where the second gate electrode is electrically connected to a second wordline electrically separated from the first wordline.

Example 17 includes the embedded memory cell of any of Examples 15-16, where the frontend circuit includes a wordline driver electrically connected to the first wordline and a sense amplifier electrically connected to the bitline.

Example 18 is an embedded memory including a plurality of first wordlines extending in a first direction, a plurality of bitlines extending in a second direction crossing the first direction, and a plurality of embedded memory cells at crossing regions of the first wordlines and the bitlines, the embedded memory cells including a first embedded memory cell and a second embedded memory cell, each of the first and second embedded memory cells having a structure of the embedded memory cell of any of Examples 15-17, with the first wordline being a corresponding one of the first wordlines and the bitline being a corresponding one of the bitlines.

Example 19 includes the embedded memory of Example 18, further including a plurality of second wordlines extending in the first direction and electrically separated from the first wordlines, where the second gate electrode in each of the first and second embedded memory cells is electrically connected to a corresponding one of the second wordlines.

Example 20 includes the embedded memory of any of Examples 18-19, where the frontend circuit includes a plurality of wordline drivers electrically connected to the first wordlines and a plurality of sense amplifiers electrically connected to the bitlines.

Example 21 is an embedded memory including: a plurality of first wordlines extending in a first direction; a plurality of bitlines extending in a second direction crossing the first direction; and a plurality of embedded memory cells at crossing regions of the first wordlines and the bitlines, the embedded memory cells including a first embedded memory cell and a second embedded memory cell, each of the first and second embedded memory cells including a backend thin-film transistor (TFT) electrically connected to a frontend circuit, the backend TFT being a ferroelectric field-effect transistor (FeFET) including a first gate electrode electrically connected to a corresponding one of the first wordlines, a second gate electrode, source and drain regions, one of the source and drain regions being electrically connected to a corresponding one of the bitlines, a semiconductor region between and physically connecting the source and drain regions, a first gate dielectric between the semiconductor region and the first gate electrode, the first gate dielectric including a ferroelectric dielectric, and a second gate dielectric between the semiconductor region and the second gate electrode.

Example 22 includes the embedded memory of Example 21, where the first and second gate electrodes are electrically separated.

Example 23 includes the embedded memory of any of Examples 21-22, where the semiconductor region includes one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

Example 24 includes the embedded memory of Example 23, where the semiconductor region includes one or more of IGZO, IZO, a-Si, LTPS, and a-Ge.

Example 25 includes the embedded memory of any of Examples 21-24, where the ferroelectric dielectric includes one or more of lead zirconate titanate (PZT), hafnium zirconium oxide (HZO), barium titanate ($BaTiO_3$), lead titanate ($PbTiO_3$), and doped hafnium dioxide ($HfO_2$).

Example 26 includes the embedded memory of Example 25, where the doped $HfO_2$ includes one or more of silicon-doped $HfO_2$, yttrium-doped $HfO_2$, and aluminum-doped $HfO_2$.

Example 27 includes the embedded memory of any of Examples 21-26, the second gate dielectric includes a high-κ dielectric.

Example 28 includes the embedded memory of Example 27, where the high-κ dielectric includes hafnium dioxide ($HfO_2$).

Example 29 includes the embedded memory of Example 28, where the second gate dielectric has a thickness between 2 and 10 nanometers (nm).

Example 30 includes the embedded memory of any of Examples 21-29, further including a plurality of second wordlines extending in the first direction and electrically separated from the first wordlines, where the second gate electrode in each of the first and second embedded memory cells is electrically connected to a corresponding one of the second wordlines.

Example 31 includes the embedded memory of any of Examples 21-30, where the frontend circuit includes a plurality of wordline drivers electrically connected to the first wordlines and a plurality of sense amplifiers electrically connected to the bitlines.

Example 32 is a method of fabricating a ferroelectric field-effect transistor (FeFET), the method including: forming a first gate electrode; forming a first gate dielectric on the first gate electrode; forming an active layer on the first gate dielectric, the active layer including source and drain regions, and a semiconductor region between the source and drain regions; forming a second gate dielectric on the semiconductor region; and forming a second gate electrode on the second gate dielectric, where one of the first and second gate dielectrics includes a ferroelectric dielectric.

Example 33 includes the method of Example 32, where the first and second gate electrodes are electrically separated.

Example 34 includes the method of any of Examples 32-33, where the semiconductor region includes one or more of indium gallium zinc oxide (IGZO), indium zinc oxide (IZO), indium tin oxide (ITO), amorphous silicon (a-Si), zinc oxide, polysilicon, poly-germanium, low-temperature polycrystalline silicon (LTPS), amorphous germanium (a-Ge), indium arsenide, copper oxide, and tin oxide.

Example 35 includes the method of Example 34, where the semiconductor region includes one or more of IGZO, IZO, a-Si, LTPS, and a-Ge.

Example 36 includes the method of any of Examples 32-35, where the ferroelectric dielectric includes one or more of lead zirconate titanate (PZT), hafnium zirconium oxide (HZO), barium titanate ($BaTiO_3$), lead titanate ($PbTiO_3$), and doped hafnium dioxide ($HfO_2$).

Example 37 includes the method of Example 36, where the doped $HfO_2$ includes one or more of silicon-doped $HfO_2$, yttrium-doped $HfO_2$, and aluminum-doped $HfO_2$.

Example 38 includes the method of any of Examples 32-37, where another of first and second gate dielectrics includes a high-κ dielectric.

Example 39 includes the method of Example 38, where the high-κ dielectric includes hafnium dioxide ($HfO_2$).

Example 40 includes the method of Example 39, where the other of the first and second gate dielectrics has a thickness between 2 and 10 nanometers (nm).

Example 41 is a method of fabricating a memory cell, the method including fabricating the FeFET by the method of any of Examples 32-40, the one of the first and second gate dielectrics being between the semiconductor region and one of the first and second gate electrodes; electrically connecting the one of the first and second gate electrodes to a first wordline; and electrically connecting one of the source and drain regions to a bitline.

Example 42 includes the method of Example 41, further including electrically connecting another of the first and second gate electrodes to a second wordline electrically separated from the first wordline.

Example 43 is a method of fabricating a memory array the method including: forming a plurality of first wordlines extending in a first direction; forming a plurality of bitlines extending in a second direction crossing the first direction; and forming a plurality of memory cells at crossing regions of the first wordlines and the bitlines, the memory cells including a first memory cell and a second memory cell, each of the first and second memory cells being fabricated by the method of any of Examples 41-42, with the first wordline being a corresponding one of the first wordlines and the bitline being a corresponding one of the bitlines.

Example 44 includes the method of Example 43, further including: forming a plurality of second wordlines extending in the first direction and electrically separated from the first wordlines; and for each of the first and second memory cells, electrically connecting another of the first and second gate electrodes to a corresponding one of the second wordlines.

Example 45 is a method of fabricating a backend thin-film transistor (TFT), the method including: fabricating the FeFET by the method of any of Examples 32-40, each of the first and second gate dielectrics and the active layer being formed by a thin-film process in a backend portion of an integrated circuit; and electrically connecting the backend TFT to a frontend circuit.

Example 46 is a method of forming an embedded memory cell including: forming the backend TFT by the method of Example 45, the one of the first and second gate dielectrics being between the semiconductor region and one of the first and second gate electrodes; electrically connecting the one of the first and second gate electrodes to a first wordline; and electrically connecting one of the source and drain regions to a bitline.

Example 47 includes the method of Example 46, further including electrically connecting another of the first and second gate electrodes to a second wordline electrically separated from the first wordline.

Example 48 includes the method of any of Examples 46-47, further including: forming a wordline driver as part of the frontend circuit; forming a sense amplifier as part of the frontend circuit; electrically connecting the wordline driver to the first wordline; and electrically connecting the sense amplifier to the bitline.

Example 49 is a method of fabricating an embedded memory, the method including: forming a plurality of first wordlines extending in a first direction; forming a plurality of bitlines extending in a second direction crossing the first direction; and forming a plurality of embedded memory cells at crossing regions of the first wordlines and the bitlines, the embedded memory cells including a first embedded memory cell and a second embedded memory cell, each of the first and second embedded memory cells being fabricated by the method of any of Examples 46-48, with the first wordline being a corresponding one of the first wordlines and the bitline being a corresponding one of the bitlines.

Example 50 includes the method of Example 49, further including: forming a plurality of second wordlines extending in the first direction and electrically separated from the first wordlines; and for each of the first and second embedded memory cells, electrically connecting another of the first and second gate electrodes to a corresponding one of the second wordlines.

Example 51 includes the method of any of Examples 49-50, further including: forming a plurality of wordline drivers as part of the frontend circuit; forming a plurality of sense amplifiers as part of the frontend circuit; electrically connecting the wordline drivers to the first wordlines; and electrically connecting the sense amplifiers to the bitlines.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A ferroelectric field-effect transistor (FeFET) comprising:
    first and second gate electrodes;
    source and drain regions;
    a region between and physically connecting the source and drain regions, the region comprising semiconductor material;
    a first gate dielectric between the region and the first gate electrode, the first gate dielectric comprising a ferroelectric dielectric; and
    a second gate dielectric between the region and the second gate electrode, wherein the second gate dielectric is not a ferroelectric dielectric.

2. The FeFET of claim 1, wherein the first and second gate electrodes are electrically separated.

3. The FeFET of claim 1, wherein the region comprises one or more of indium, gallium, zinc, oxygen, tin, amorphous silicon (a-Si), polysilicon, poly-germanium, low-temperature polycrystalline silicon (LTPS), amorphous germanium (a-Ge), arsenic, or copper.

4. The FeFET of claim 1, wherein the ferroelectric dielectric comprises one or more of lead, zirconium, titanium, hafnium, barium, lead, or oxygen.

5. The FeFET of claim 1, wherein the ferroelectric dielectric is doped with one or more of silicon, yttrium, or aluminum.

6. The FeFET of claim 1, wherein the second gate dielectric comprises a high-κ dielectric, wherein the high-κ dielectric comprises hafnium and oxygen, and wherein the second gate dielectric has a thickness between 2 and 10 nanometers (nm).

7. A memory cell comprising the FeFET of claim 1, the first gate electrode being electrically connected to a first wordline and one of the source and drain regions being electrically connected to a bitline.

8. The memory cell of claim 7, wherein the second gate electrode is electrically connected to a second wordline electrically separated from the first wordline.

9. A memory array comprising a plurality of first wordlines extending in a first direction, a plurality of bitlines extending in a second direction crossing the first direction, and a plurality of memory cells at crossing regions of the first wordlines and the bitlines, the memory cells including a first memory cell and a second memory cell, each of the first and second memory cells having a structure of the memory cell of claim 7, with the first wordline being a corresponding one of the first wordlines and the bitline being a corresponding one of the bitlines.

10. The memory array of claim 9, further comprising a plurality of second wordlines extending in the first direction and electrically separated from the first wordlines, wherein the second gate electrode in each of first and second memory cells is electrically connected to a corresponding one of the second wordlines.

11. A backend thin-film transistor (TFT) comprising the FeFET of claim 1, the backend TFT being electrically connected to a frontend circuit.

12. An embedded memory cell comprising the backend TFT of claim 11, the first gate electrode being electrically connected to a first wordline and one of the source and drain regions being electrically connected to a bitline.

13. The embedded memory cell of claim 12, wherein the second gate electrode is electrically connected to a second wordline electrically separated from the first wordline.

14. The embedded memory cell of claim 12, wherein the frontend circuit comprises a wordline driver electrically connected to the first wordline and a sense amplifier electrically connected to the bitline.

15. An embedded memory comprising a plurality of wordlines extending in a first direction and including a first wordline and a second wordline, a plurality of bitlines extending in a second direction and including a first bitline and a second bitline, a first memory cell at a first crossing region of the first wordline and the first bitline, and a second memory cell at a second crossing region of the second wordline and the second bitline, each of the first and second memory cells having a structure of the embedded memory cell of claim 12.

16. The embedded memory of claim 15, wherein the plurality of wordlines is a first plurality of wordlines, the embedded memory further comprising a second plurality of wordlines extending in the first direction and electrically separated from the first plurality of wordlines, wherein the second gate electrode in each of the first and second embedded memory cells is electrically connected to a corresponding one of the second plurality of wordlines.

17. The embedded memory of claim 15, wherein the frontend circuit comprises first and second wordline drivers electrically connected to the first and second wordlines, and first and second sense amplifiers electrically connected to the first and second bitlines.

18. An integrated circuit structure comprising:
- a source region and a drain region;
- a body of semiconductor material between the source and drain regions;
- a first gate stack on a first side of the body, the first gate stack including a first gate dielectric comprising a ferroelectric dielectric; and
- a second gate stack on a second side of the body, the second side opposite the first side, the second gate stack including a second gate dielectric comprising a high-κ dielectric, wherein the second gate dielectric is not a ferroelectric dielectric.

19. The integrated circuit structure of claim 18, wherein:
the first gate stack comprises a first gate electrode; the second gate stack comprises a second gate electrode; and
the first and second gate electrodes are electrically separated.

20. A memory cell comprising the integrated circuit structure of claim 19, wherein the first gate electrode is electrically connected to a first wordline and one of the source and drain regions is electrically connected to a bitline, and wherein the second gate electrode is electrically connected to a second wordline electrically separated from the first wordline.

* * * * *